United States Patent
Hashida

Patent Number: 6,028,431
Date of Patent: *Feb. 22, 2000

[54] ON-BOARD WIRING FAULT DETECTION DEVICE

[75] Inventor: Yasunori Hashida, Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/889,582

[22] Filed: Jul. 8, 1997

[30] Foreign Application Priority Data

Mar. 25, 1997 [JP] Japan ................... 9-702478

[51] Int. Cl.⁷ .................................. G01R 31/00
[52] U.S. Cl. .............. 324/537; 324/158.1; 324/73.1
[58] Field of Search ................... 324/537, 73.1, 324/527, 158.1, 763; 371/20

[56] References Cited

U.S. PATENT DOCUMENTS

| | | | |
|---|---|---|---|
| 4,194,113 | 3/1980 | Fulks | 371/20 |
| 4,196,386 | 4/1980 | Phelps | 371/22.6 |
| 5,285,152 | 2/1994 | Hunter | 324/73.1 |
| 5,410,247 | 4/1995 | Ishizuka | 324/158.1 |
| 5,537,052 | 7/1996 | Wilson | 324/763 |
| 5,565,766 | 10/1996 | Kuwahara | 324/158.1 |

FOREIGN PATENT DOCUMENTS

| | | |
|---|---|---|
| 0058948 | 9/1982 | European Pat. Off. |
| 60-116040 | 6/1985 | Japan |
| 7311695 | 11/1995 | Japan |
| 8123704 | 5/1996 | Japan |

OTHER PUBLICATIONS

Buckner et al., "Detecting Wiring Errors", IBM Technical Disclosure Bulletin, vol. 5, No. 1, pp. 60–61, Jun. 1962.

"Digital Wrap Built–in Self–Test For Future AWD System", IBM Technical Disclosure Bulletin, vol. 33, No. 9, pp. 13–14, Feb. 1991.

Primary Examiner—Josie Ballato
Assistant Examiner—T. R. Sundaram
Attorney, Agent, or Firm—Leydig, Voit & Mayer, Ltd

[57] ABSTRACT

A board wiring fault detection device has an analog-to-digital converter for receiving an optionally set test signal output from a peripheral device, a first memory for storing the test signal, a second memory for storing a predicted data item to be compared to the test signal stored in the first memory, the predicted data item being indicative of a no fault state of a board wiring, and a comparator for comparing test signal to the predicted data item in the first and second memories. The comparator outputs a comparison result to the outside. The peripheral device outputs the test signal upon every release of a reset signal and performs processing.

7 Claims, 5 Drawing Sheets

ON-BOARD WIRING FAULT DETECTION DEVICE

BACKGROUND OF THE INVENTION

1. Field of the Invention

The present invention relates to a board-wiring fault detection device formed on a printed-substrate or a print-circuit board for detecting a fault of wirings for connecting a microcomputer and peripheral devices formed on the print-circuit board.

2. Description of the Prior Art

Conventionally, in electronic devices using or incorporating a microcomputer, a microcomputer and peripheral devices are formed on a printed substrate and then wirings are formed in order to electrically connect the microcomputer with the peripheral devices.

For example, there are following conventional techniques (1) to (3) as fault detection devices for detecting a fault of a device by using a microcomputer:

(1) Japanese laid-open publication number JP-A-60/116040 discloses a conventional technique in which the operation flow enters a normal processing operation after the state of a data processing device is detected by checking whether a fault detection signal is in a set state or in a reset state;

(2) Japanese laid-open publication number JP-A-7/311695 disclosed a technique in which a runaway of a microcomputer is detected based on a reset-signal generation decision method by comparing a general purpose timer with a CPU timer; and (3) Japanese laid-open publication number JP-A-8/123704 disclosed a technique in which a reset operation is executed when an abnormal operation occurs and is detected, and then an automatic-return decision means checks whether an automatic-return operation is to be processed or not.

As described above, a microcomputer is electrically connected to various peripheral devices through wirings in the conventional techniques. However, there are no devices to automatically detect a board-wiring fault after a reset-signal is released. Therefore, there is a possibility to use an electrical device having a board-wiring fault because it is impossible to detect the fault of the board-wiring in the electrical device. In this case, there is a drawback in the conventional techniques that the microcomputer connected to peripheral devices through board-wirings causes problems such as runaway of a program, destruction of a program, and the like.

SUMMARY OF THE INVENTION

Accordingly, an object of the present invention is, with due consideration to the drawbacks of the conventional techniques, to provide a board-wiring fault detection device that is capable of automatically detecting a fault of board-wirings formed on an IC mounting board every releasing of a reset signal.

In accordance with a preferred embodiment of the present invention, a board wiring fault detection device for testing whether a board-wiring connected between a peripheral device and a microcomputer is in a fault state or not, comprises the peripheral device for generating and outputting a test signal, input means for receiving the test signal output from the peripheral device after a reset signal has been released, first memory means for storing the output from the input means, second memory means for storing a predicted data item that is a data item to be stored in the first memory means when a board wiring being in no fault state, and comparison decision means for comparing the data stored in the first memory means with the data stored in the second memory means and for outputting a fault decision signal as a comparison result.

In the board wiring fault detection device as another preferred embodiment of the present invention, the input means is analogue/digital conversion means for converting an analogue signal as the test signal output from the peripheral device to digital signals during an optionally-set time period, and both the first memory means and the second memory means are registers.

In the board wiring fault detection device as another preferred embodiment of the present invention, the input means is a pulse count timer for counting pulses as the test signal transferred from the peripheral device during an optionally-set time period.

In the board wiring fault detection device as another preferred embodiment of the present invention, the peripheral device and the microcomputer are mounted on an IC mounting board, and the microcomputer comprises the input means, the first memory means, the second memory means, and the comparison decision means.

In accordance with another preferred embodiment of the present invention, a board wiring fault detection device for testing whether a first board-wiring and a second board wiring connected between a first peripheral device and a second peripheral device and a microcomputer are in a fault state or not, comprises a first switch and a second switch having timer function for electrically connecting the first board wiring and the second board wiring to a board wiring check path during an optionally-set time period in a board wiring test mode after a reset signal has been released, output means for outputting a test signal to the first peripheral device and for outputting a test signal during the board-wiring test mode to the board wiring check path, input means for inputting signal output from the second peripheral device and for inputting the test signal through the board-wiring check path during the board wiring test mode, first memory means for storing the output from the input means, second memory means for storing a predicted data item that is a data item to be stored in the first memory means when the first board wiring and the second board wiring being in no fault state, and comparison decision means for comparing the data stored in the first memory means with the data stored in the second memory means and for outputting a fault decision signal as a comparison result.

In the board wiring fault detection device as another preferred embodiment, the output means is a digital/analogue conversion means for outputting an analogue signal as the test signal, the input means is an analogue/digital conversion means for converting the analogue signal to digital signals, and both the first memory means and the second memory means are registers.

In the board wiring fault detection device as another preferred embodiment, the output means is a pulse output timer for outputting pulses as the test signal during an optionally-set time period after a reset signal has been released, the input means is a pulse count timer for counting the number of the pulses during the optionally-set time period, and both the first memory means and the second memory means are registers.

In the board wiring fault detection device as another preferred embodiment, the output means is a serial communication output circuit for outputting a data item as the test signal, the input means is a serial communication input circuit for inputting the data item, and both the first memory means and the second memory means are registers.

In the board wiring fault detection device as another preferred embodiment, the first peripheral device, the second peripheral device, and the microcomputer are mounted on an IC mounting board, and the microcomputer comprises the output means, the input means, the first memory means, the second memory means, and the comparison decision means.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a board-wiring fault detection device according to the present invention will now be described with reference to the drawings.

First embodiment

Figure 1:
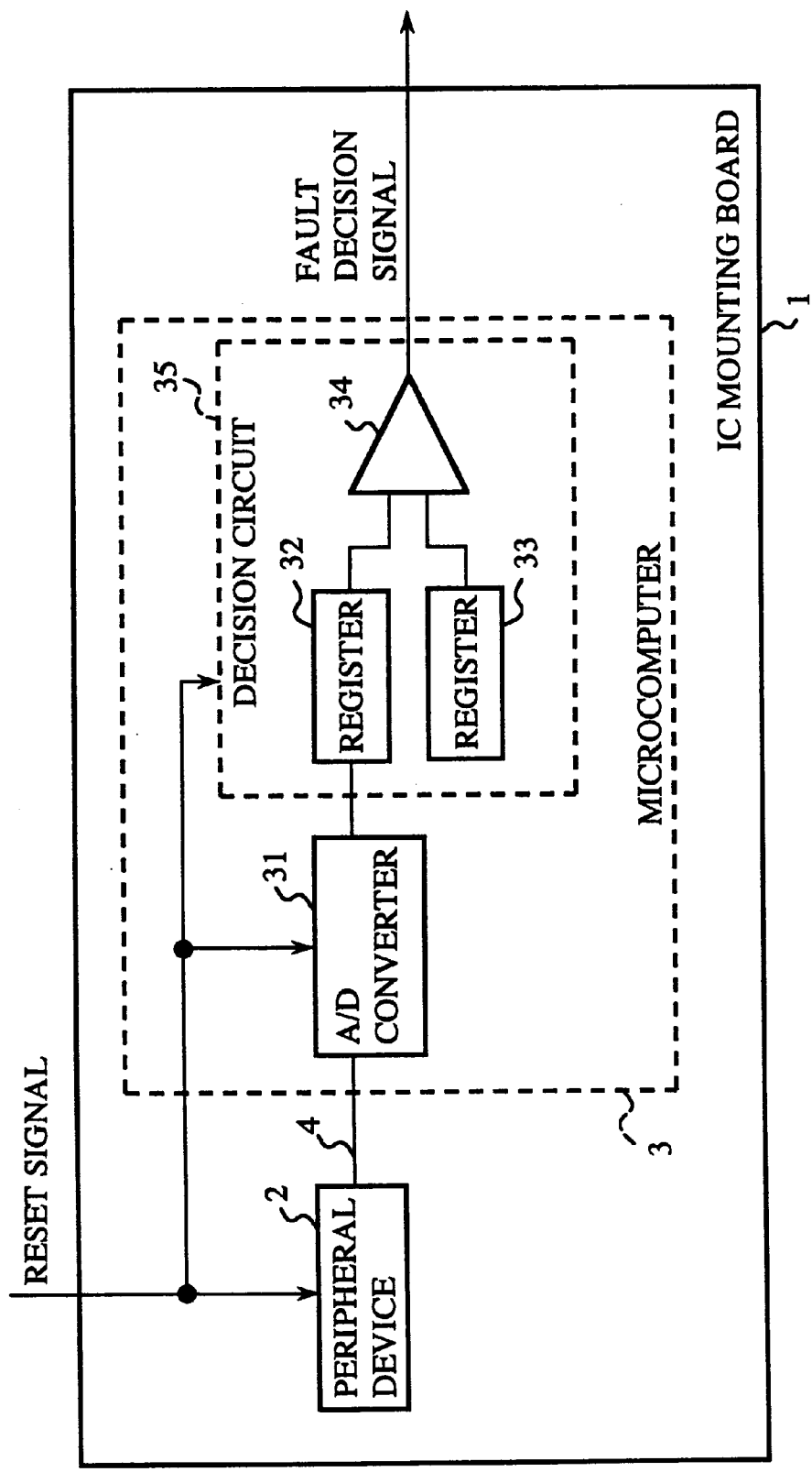
FIG. 1 is a diagram showing a configuration of a board-wiring fault detection device as a first embodiment according to the present invention.

FIG. 1 is a diagram showing a configuration of a board-wiring fault detection device according to a first embodiment according to the present invention. In FIG. 1, the reference number 1 designates an IC mounting board, 2 denotes a peripheral device formed on the IC mounting board 1, 3 indicates a microcomputer formed on the IC mounting board 1, 4 designates board-wiring, namely wiring formed on the IC mounting board 1 through which the peripheral device 2 is electrically connected to the microcomputer 3. In actual case, although the number of each of the board-wirings and the peripheral devices formed on the IC mounting board 1 is more than one, respectively, only one board-wiring 4 and one peripheral device 2 are used in the explanation of the first to fifth embodiments according to the present invention for brevity.

The microcomputer 3 described above comprises an analog-to-digital convert device (hereinafter referred to as an A/D converter) as an input means, a register 32 as a first memory means, a register 33 as a second memory means, and a comparison decision device 34 as a comparison decision means. The A/D converter 31 converts an analog input voltage to a digital output voltage. The register 32 stores the digital output voltage. The register 33 stores a value that is to be stored in the register 32 when the board-wiring 4 has no fault, that is, when the board-wiring 4 can be used correctly. The comparison decision device (hereinafter referred to as comparator) 34 compares the value stored in the register 32 with the value stored in the register 33, and then outputs a fault decision signal about the state of the board wiring 4. The decision circuit 35 comprises the register 32, the register 33, and the comparison decision device 34. Thus, the board-wiring fault detection device of the first embodiment comprises the peripheral device 2, the board-wiring 4, and the A/D converter 31 and the decision circuit 35 including the registers 32 and 33 and the comparator 34 incorporated in the microcomputer 2.

Next, a description will now be given of the operation of the board-wiring fault detection device according to the first embodiment.

First, the entire operation of the board-wiring fault detection device will be explained.

When a reset signal is released while the IC mounting board is used, the board-wiring fault detection device enters a board-wiring fault detection mode. This board-wiring fault detection mode is the mode in which the board-wiring 4, which is used for data communication between the microcomputer 3 and the peripheral device 2 and to electrically connect them during a normal operation, is used for checking output signals from the microcomputer 3 or the peripheral device 2 in order to detect a fault of the board-wiring 4 every re-setting operation. In the board-wiring fault detection mode, the peripheral device 2 outputs an analog value as the test signal during an optional constant time period and then enters the normal operation mode. The microcomputer 3 performs the fault detection operation during the optional constant time period and then enters the normal operation mode.

Next, the board-wiring fault detection operation of the first embodiment will now be explained in detail.

As described above, when the board-wiring detection device enters the board-wiring fault detection mode after the reset signal has been released, the peripheral device 2 outputs the analog voltage as the test signal during the constant time period that has been set by hardware or by software.

The analog voltage output from peripheral device 2 is provided to the A/D converter 31 in the microcomputer 3 through the board wiring 4. The A/D converter 31 converts the analog voltage to a digital value during the optional constant time period and then outputs the digital value to the register 32. The register 32 stores the digital value from the A/D converter 31. The digital value stored in the register 32 is compared with a stored value in the register 33 by the comparison decision device 34. When the comparison result indicates that the values stored in both the registers 32 and 33 are different, the decision circuit 35 generates a fault decision signal "NG" based on the comparison result and outputs it to outside. Thereby, the operation of the microcomputer 3 is stopped. Since the decision signal "NG" is output form the decision circuit 35 to outside of the IC mounting board 1, it is possible to check the failure of the IC mounting board 1 and to stop the use of this IC mounting board 1.

On the other hand, when the values stored in both the registers 32 and 33 are equal, the decision circuit 35 generates a decision signal "OK" based on the decision result and outputs it to the outside. Thereby, the microcomputer 3 enters the normal operation mode after a optional constant time period has elapsed. The peripheral device 2 also enters the normal operation mode after the optional constant time period has elapsed. These timings to detect the fault of the board-wiring 4 by the microcomputer 3 and the peripheral device 2 can be set by hardware or software. These timings are also synchronized to each other. Further, because the timings required to re-enter or return to the normal operation mode for both the peripheral device 2 and the microcomputer 3 are set by the hardware or the software in advance, and these timings are synchronized to each other. Therefore, of the peripheral device 2 and the microcomputer 3 can perform normal operations after the board-wiring fault detection mode.

As described above, according to the board-wiring fault detection device of the first embodiment, the analogue voltage as the test signal output from the peripheral device 2 is inputted to the A/D converter 31 incorporated in the microcomputer 3 through the board wiring 4. Thereby, it is possible to detect a fault of the board-wiring 4 and it is possible to prevent occurrences of problems such as non-matching to other devices, an occurrence of an accident and the like caused when the IC mounting board 1 having the fault board wiring 4 is used. In addition to this, because the fault detection operation of the board wiring 4 is performed by using the A/D converter 31, the register 32, the register 33 incorporated in the microcomputer 3, there is no requirement to add any IC used for detecting the fault of the board-wiring 4. This decreases the design time and the cost of the IC mounting board 1 incorporating the various devices such as the peripheral device 2 and the microcomputer 3 and the like.

Second embodiment

Figure 2:
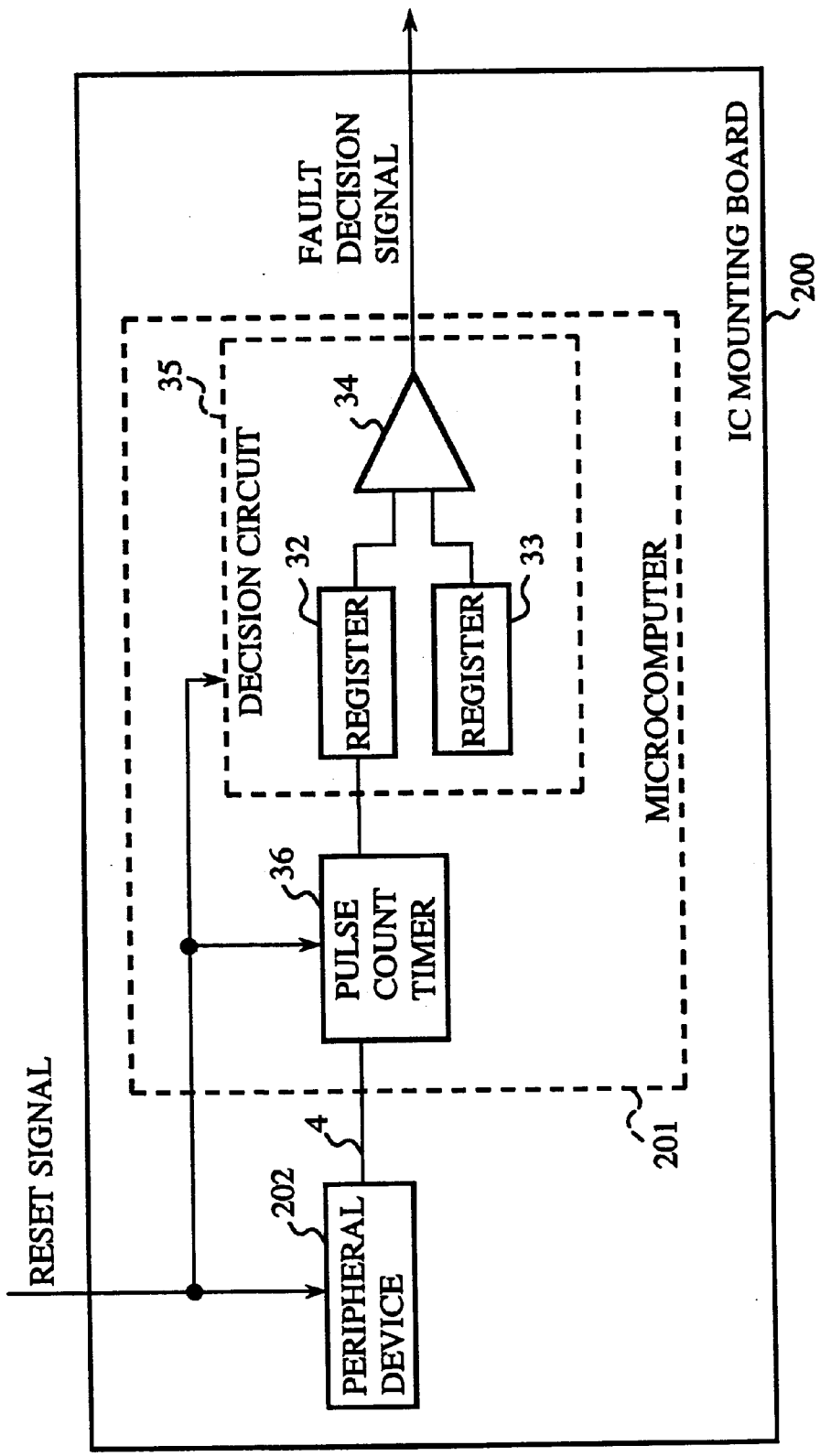
FIG. 2 is a diagram showing a configuration of a board-wiring fault detection device as a second embodiment according to the present invention.

FIG. 2 is a diagram showing a configuration of a board-wiring fault detection device according to the second embodiment according to the present invention. In FIG. 2, the reference number 200 designates an IC mounting board, 201 designates a microcomputer, 202 denotes a peripheral device, and 36 designates a pulse count timer as an input means for counting the number of pulses transferred from the peripheral device 202. The board-wiring fault detection device of the second embodiment comprises the peripheral device 202, the board-wiring 4, and the pulse count timer 36 and the decision circuit 35 including the registers 32 and 33 and the comparator 34 incorporated in the microcomputer 201 formed on the IC mounting board 200. Other components used in the second embodiment are same as those of the first embodiment shown in FIG. 1, therefore, the explanation of them is omitted and the same reference numbers are also used for them in the description of the second embodiment.

Next, a description will be given of the operation of a board-wiring fault detection device according to the second embodiment.

First, the entire operation of the board-wiring fault detection device will be explained.

When a reset signal is released while the IC mounting board 200 is used, the board-wiring fault detection device enters a board-wiring fault detection mode. In the board-wiring fault detection mode, the peripheral device 202 outputs pulses as the test signal in order to detect a fault of the board wiring 4 during an optional constant time period and then enters the normal operation mode. The microcomputer 201 performs the fault detection operation during the optional constant time period and then enters the normal operation mode.

Next, the board-wiring fault detection operation of the second embodiment will now be explained in detail.

As described above, when the board-wiring fault detection device of the second embodiment enters the board-wiring fault detection mode after the reset signal has been released, the peripheral device 202 outputs pulses, whose number is set by hardware or software, in a constant time period. The pulses output from the peripheral device 202 are provided to the pulse count timer 36 incorporated in the microcomputer 201 through the board wiring 4. The pulse count timer 36 counts the number of pulses during the optional constant time period and the counted result is provided to the register 32. The register 32 stores the counted result output from the pulse count timer 36. The comparator 34 compares the value stored in the register 32 with the value that has been already stored in the register 33.

When the comparison result indicates that the both values stored in both the registers 32 and 33 are different, the decision circuit 35 generates a fault decision signal "NG" based on the comparison result and outputs it to outside devices. Thereby, the operation of the microcomputer 201 is stopped. Since the decision signal "NG" is output form the decision circuit 35 to outside of the IC mounting board 200, it is possible to check the failure of the IC mounting board 200 and to stop the use of this IC mounting board 200.

On the other hand, when the values stored in both the registers 32 and 33 are equal, the decision circuit 35 generates a decision signal "OK" based on the decision result and outputs it to outside devices. Thereby, the microcomputer 201 enters the normal operation mode after an optional constant time period is elapsed. The peripheral device 202 also enters the normal operation mode after the optional constant time period is elapsed. These timings to detect the fault of the board-wiring 4 by the microcomputer 201 and the peripheral device 202 can be set by hardware or software. These timings are also synchronized to each other. Further, the timings required to re-enter or return to the normal operation mode for both the peripheral device 202 and the microcomputer 201 are set by the hardware or the software in advance and these timings are synchronized to each other. Therefore, the peripheral device 202 and the microcomputer 201 can perform normal operations after the board-wiring fault detection mode.

As described above, according to the board-wiring fault detection device of the second embodiment, the pulses output from the peripheral device 202 are inputted to the pulse count timer 36 incorporated in the microcomputer 201 through the board wiring 4. Thereby, it is possible to detect the fault of the board-wiring 4 and it is possible to prevent occurrences of problems such as non-matching to other devices, an occurrence of an accident and the like caused when the IC mounting board 200 having the fault board wiring 4 is used. In addition to this, because the fault detection operation of the board wiring 4 is performed by using the pulse count timer 36, the register 32, the register 33 incorporated in the microcomputer 201, there is no requirement to add any IC used for detecting the fault of the board-wiring 4. This decreases the design time and the cost of the IC mounting board 200 incorporating the various devices such as the peripheral device 202 and the microcomputer 201 and the like.

Third embodiment

Figure 3:
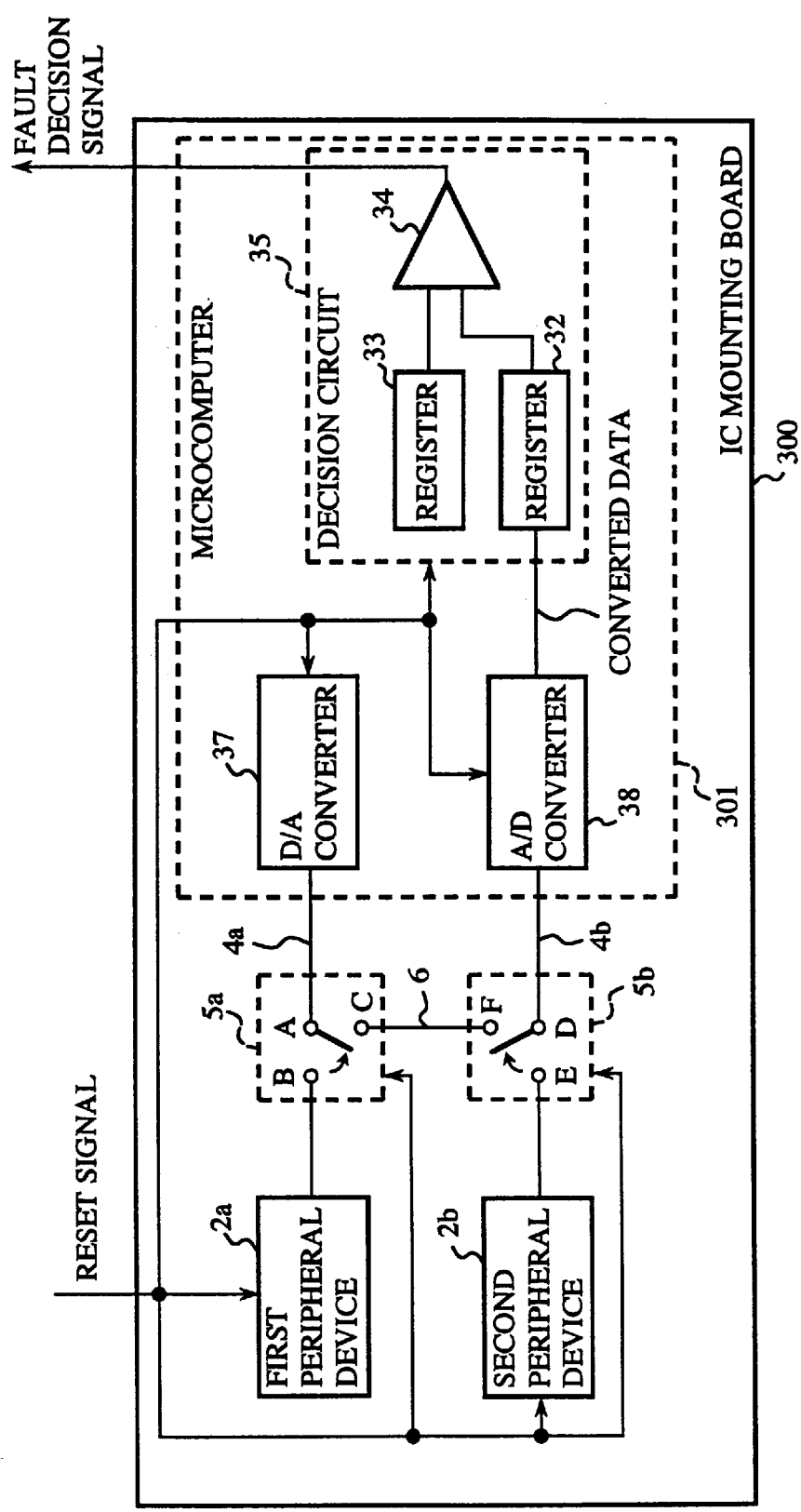
FIG. 3 is a diagram showing a configuration of a board-wiring fault detection device as a third embodiment according to the present invention.

FIG. 3 is a diagram showing a configuration of a board-wiring fault detection device according to a third embodiment according to the present invention. In FIG. 3, the reference number 300 designates an IC mounting board, 2a and 2b denote a first peripheral device and a second peripheral device, respectively. The reference numbers 4a and 4b denote a first board wiring and a second board wiring, respectively. The reference number 301 designates a microcomputer connected to the first peripheral device 2a and the second peripheral device 2b through the first board wiring 4a and the second board wiring 4b. The reference numbers 5a and 5b indicate a first switch and a second switch for use of a wiring check operation for switching the board wiring 4a and the board wiring 4b to a branch wiring 6 during an optional constant time period after the reset signal is released.

The microcomputer 301 described above comprises a digital-to-analog convert device (hereinafter referred to as a D/A converter) as an output means to output a signal to the first peripheral device 2a, an analog-to-digital converter device (hereinafter referred to as a A/D converter) as an input means to input the signal output from the second peripheral device 2b. Other components are same as those in the first embodiment, therefore, the explanation of them is omitted here and the same reference numbers are sued in the description of the second embodiment.

Next, a description will be given of the operation of the board-wiring detection device of the third embodiment.

First, the entire operation of the board-wiring fault detection device will be explained.

When a reset signal is released while the IC mounting board 300 is used, the board-wiring fault detection device enters a board-wiring fault detection mode. After the reset signal is released, the operation of each of the peripheral devices 2a and 2b is stopped, and the devices the normal operation mode after an optional constant time period has been elapsed. The first switch 5a switches from a path, formed by the node A and the node B that is used in the normal operation mode, to the path (connected to the branch wiring 6) formed by the node A and the node C after the reset signal has been released. The second switch 5b switches from a path, formed by the node D and the node E that is used in the normal operation mode, to the path (connected to the branch wiring 6) formed by the node D and the node F after the reset signal has been released.

Both the first switch 5a and the second switch 5b switch the current path to the paths A–B and the path D–E which are used under the normal operation mode, respectively, after the optional constant time period has elapsed. The microcomputer 301 performs the fault detection operation during the optional constant time period and then enters the normal operation mode.

Next, the board-wiring fault detection operation of the third embodiment will be explained in detail.

As described above, when the board-wiring fault detection device of the third embodiment enters the board-wiring fault detection mode after the reset signal has been released, both the first and second peripheral devices 2a and 2b stop their operation during the optional constant time period that has been set by hardware or software. Then, the first and second switches 5a and 5b switch from the paths A–B and D–E, that are used in the normal operation mode, to the paths A–C and D–F connected to the branch wiring 6, respectively. Thereby, a checking path for checking a fault of the board wirings 4a and 4b can be formed. This checking path is formed by the path comprising the D/A converter 37, the board wiring 4a, the first switch 5a including the path A–C, the branch wiring 6 to be used for checking the board wirings 4a and 4b, the second switch 5b including the path F–D, and the board wiring 4b, and the A/D converter 38. Next, the D/A converter 37 outputs the analog voltage as the test signal whose magnitude and whose timing are set by hardware or software during a constant time period. This analog voltage is provided from the D/A converter 37 to the A/D converter 38 through the board wiring 4a, the first switch 5a including the path A–C, the branch wiring 6 to be used for checking the board wirings 4a and 4b, the second switch 5b including the path F–D, and the board wiring 4b.

The A/D converter 38 converts the analog voltage to digital values during the optional constant time period set by the hardware or the software and outputs them to the register 32. The register 32 stores the digital values output from the A/D converter 38. On the other hand, the register 33 stores predicted values to be stored into the register 32 only when the board wirings 4a and 4b have no fault in advance. Accordingly, the comparator 34 compares the predicted values stored in the register 33 with the values stored in the register 32.

When the comparison result indicates that the values stored in both the registers 32 and 33 are different, the decision circuit 35 generates a fault decision signal "NG" based on the comparison result and outputs it to outside devices. Thereby, the operation of the microcomputer 301 is stopped. Since the decision signal "NG" is output form the decision circuit 35 to outside devices of the IC mounting board 300, it is possible to check the failure of the IC mounting board 300 and to stop the use of this IC mounting board 300.

On the other hand, when the values stored in both the registers 32 and 33 are equal, the decision circuit 35 generates a decision signal "OK" based on the decision result and outputs it to outside devices. Thereby, the microcomputer 301 enters the normal operation mode after an optional constant time period has elapsed. The peripheral devices 2a and 2b also enter the normal operation mode after the optional constant time period has elapsed. These timings to detect the fault of the board-wirings 4a and 4b by the microcomputer 301 and the peripheral devices 2a and 2b can be set by hardware or software. These timings are also synchronized to each other. Further, the timings required to re-enter or return to the normal operation mode for both of the peripheral devices 2a and 2b and the microcomputer 301 are set by the hardware or the software in advance and these timings are synchronized to each other. Therefore, the peripheral devices 2a and 2b and the microcomputer 301 can perform normal operations after the board-wiring fault detection mode.

As described above, according to the board-wiring fault detection device of the third embodiment, the analog signal output from the D/A converter 37 incorporated in the microcomputer 301 are inputted to the A/D converter 38 through the board wirings 4a and 4b, and the branch wiring 6. Thereby, it is possible to detect the fault of the board-wirings 4a and 4b by using the microcomputer 301 itself and it is possible to prevent occurrences of problems such as an occurrence of un-matching to other devices, an occurrence of an accident and the like caused when the IC mounting board 200 having the fault board wirings 4a and 4b is used. In addition to this, because the fault detection operation of the board wirings 4a and 4b is performed by using the D/A converter 37, the A/D converter 38, the register 32, and the register 33 incorporated in the microcomputer 301, there is no requirement to add any IC used for detecting the fault of the board-wirings 4a and 4b. This decreases the design time and the cost of the IC mounting board 300 incorporating the various devices such as the peripheral devices 2a and 2b and the microcomputer 301 and the like.

Fourth embodiment

Figure 4:
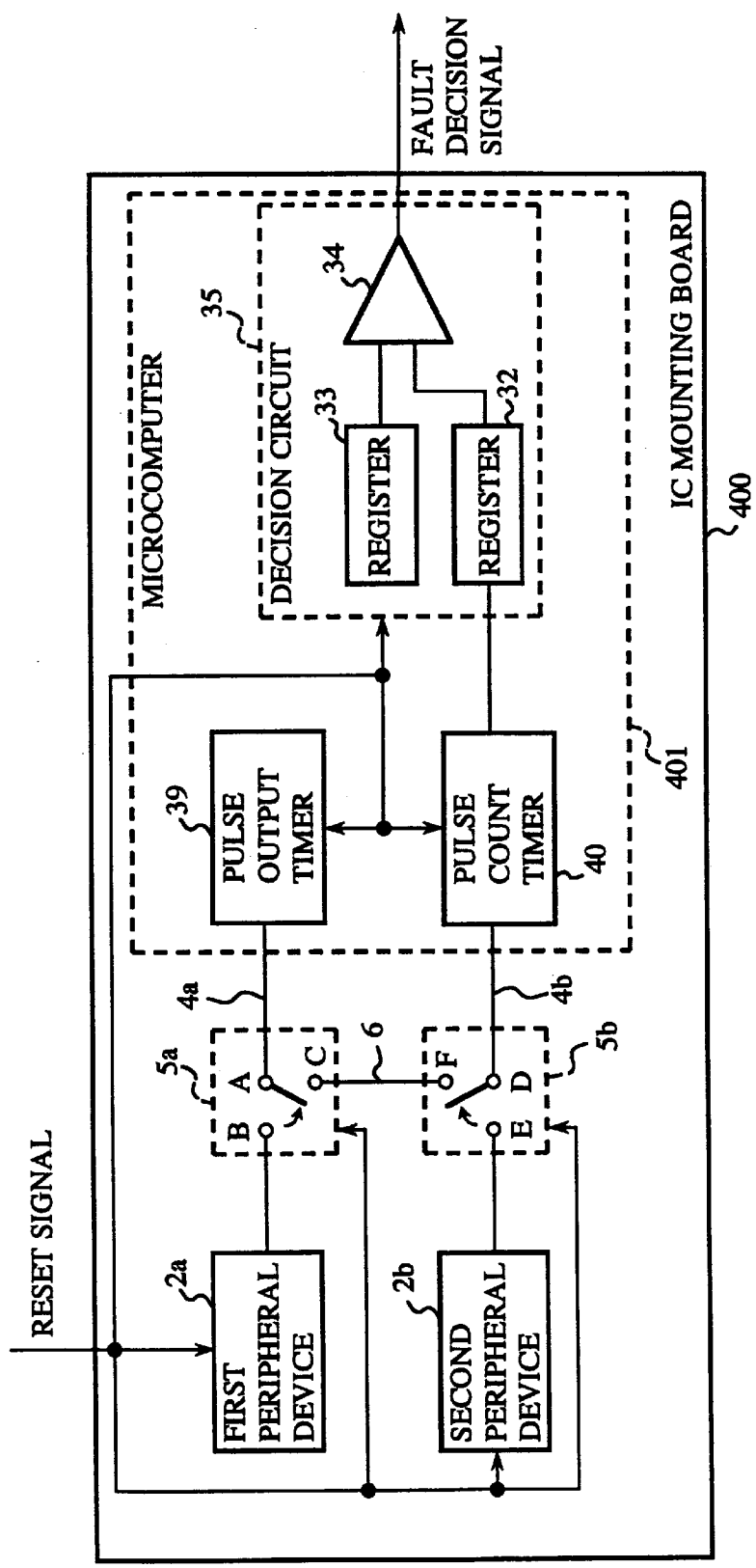
FIG. 4 is a diagram showing a configuration of a board-wiring fault detection device as a fourth embodiment according to the present invention.

FIG. 4 is a diagram showing a configuration of a board-wiring fault detection device according to a fourth embodiment according to the present invention. In FIG. 4, the reference number 400 designates an IC mounting board, 401 denotes a microcomputer. The microcomputer 401 comprises a pulse output timer (output means) 39 for outputting pulses during a predetermined time period after a reset signal is released and a pulse count timer (input means) 40 for counting pulses during the predetermined time period after the reset signal is released. Other components of the fourth embodiment are same as those in the third embodiment, therefore, the same reference numbers are also used in the fourth embodiment and the explanation of them is omitted here for brevity.

Next, a description will now be given of the operation of the board-wiring detection device of the fourth embodiment.

First, the entire operation of the board-wiring fault detection device will now be explained.

When a reset signal is released while the IC mounting board 400 is used, the board-wiring fault detection device enters a board-wiring fault detection mode. After the reset signal is released, the operation of each of the peripheral devices 2a and 2b is stopped, and the devices enter the normal operation mode after an optional constant time period has been elapsed. The first switch 5a switches a path, formed by the node A and the node B that is used in the normal operation mode, to the path (connected to the branch wiring 6) formed by the node A and the node C after the reset signal has been released. The second switch 5b switches from a path, formed by the node D and the node E that is used in the normal operation mode, to the path (connected to the branch wiring 6) formed by the node D and the node F after the reset signal has been released.

Both the first switch 5a and the second switch 5b switch from the current paths path to the paths A–B and the path D–E which are used under the normal operation mode, respectively, after the optional constant time period has elapsed. The microcomputer 401 performs the fault detection operation during the optional constant time period and then enters the normal operation mode.

Next, the board-wiring fault detection operation of the fourth embodiment will now be explained in detail.

As described above, when the board-wiring fault detection device of the fourth embodiment enters the board-wiring fault detection mode after the reset signal has been released, both the first and second peripheral devices 2a and 2b stop those operation during the optional constant time period that has been set by hardware or software. Then, the first and second switches 5a and 5b switch from the paths A–B and D–E, that are used in the normal operation mode, to the paths A–C and D–F connected to the branch wiring 6, respectively. Thereby, a checking path for checking a fault of the board wirings 4a and 4b can be formed. This checking path is formed by the path comprising the pulse output timer 39, the board wiring 4a, the first switch 5a including the path A–C, the branch wiring 6 to be used for checking the board wirings 4a and 4b, the second switch 5b including the path F–D, and the board wiring 4b, and the pulse count timer 40.

Next, the pulse output timer 39 outputs the pulses as the test signals whose number is set by the hardware or the software to outside during a constant time period. The pulses are provided from the pulse output timer 39 to the pulse input timer 40 through the board wiring 4a, the first switch 5a including the path A–C, the branch wiring 6 to be used for checking the board wirings 4a and 4b, the second switch 5b including the path F–D, and the board wiring 4b.

The pulse count timer 40 counts the number of the pulses during the optional constant time period set by the hardware or the software and outputs them to the register 32. The register 32 stores the digital values output from the pulse count timer 40. On the other hand, the register 33 stores predicted values to be stored into the register 32 only when the board wirings 4a and 4b have no fault in advance. Accordingly, the comparator 34 compares the predicted values stored in the register 33 with the values stored in the register 32.

When the comparison result indicates that the values stored in both the registers 32 and 33 are different, the decision circuit 35 generates a fault decision signal "NG" based on the comparison result and outputs it to outside. Thereby, the operation of the microcomputer 401 is stopped. Since the decision signal "NG" is output from the decision circuit 35 to outside of the IC mounting board 400, it is possible to check the failure of the IC mounting board 400 and to stop the use of this IC mounting board 400.

On the other hand, when the values stored in both the registers 32 and 33 are equal, the decision circuit 35 generates a decision signal "OK" based on the decision result and outputs it the outside. Thereby, the microcomputer 401 enters the normal operation mode after an optional constant time period is elapsed. The peripheral devices 2a and 2b also enter the normal operation mode after the optional constant time period is elapsed. These timings to detect the fault of the board-wirings 4a and 4b by the microcomputer 401 and the peripheral devices 2a and 2b can be set by hardware or software. These timings are also synchronized to each other. Further, the timings required to re-enter or return to the normal operation mode for both the peripheral devices 2a and 2b and the microcomputer 401 are set by the hardware or the software in advance and these timings are synchronized to each other. Therefore, the peripheral devices 2a and 2b and the microcomputer 401 can perform normal operations after the board-wiring fault detection mode.

As described above, according to the board-wiring fault detection device of the fourth embodiment, the pulses output from the pulse output timer 39 incorporated in the microcomputer 401 are inputted to the pulse count timer 40 through the board wirings 4a and 4b, and the branch wiring 6. Thereby, it is possible to detect the fault of the board-wirings 4a and 4b by using the microcomputer 401 itself and it is possible to prevent occurrences of problems such as non-matching to other devices, an occurrence of an accident and the like caused when the IC mounting board 400 having the fault board wirings 4a and 4b is used. In addition to this, because the fault detection operation of the board wirings 4a and 4b is performed by using the pulse output timer 39, the pulse count timer 40, the register 32, and the register 33 incorporated in the microcomputer 401, there is no requirement to add any IC used for detecting the fault of the board-wirings 4a and 4b. This decreases the design time and the cost of the IC mounting board 400 incorporating the various devices such as the peripheral devices 2a and 2b and the microcomputer 401 and the like.

Fifth embodiment

Figure 5:
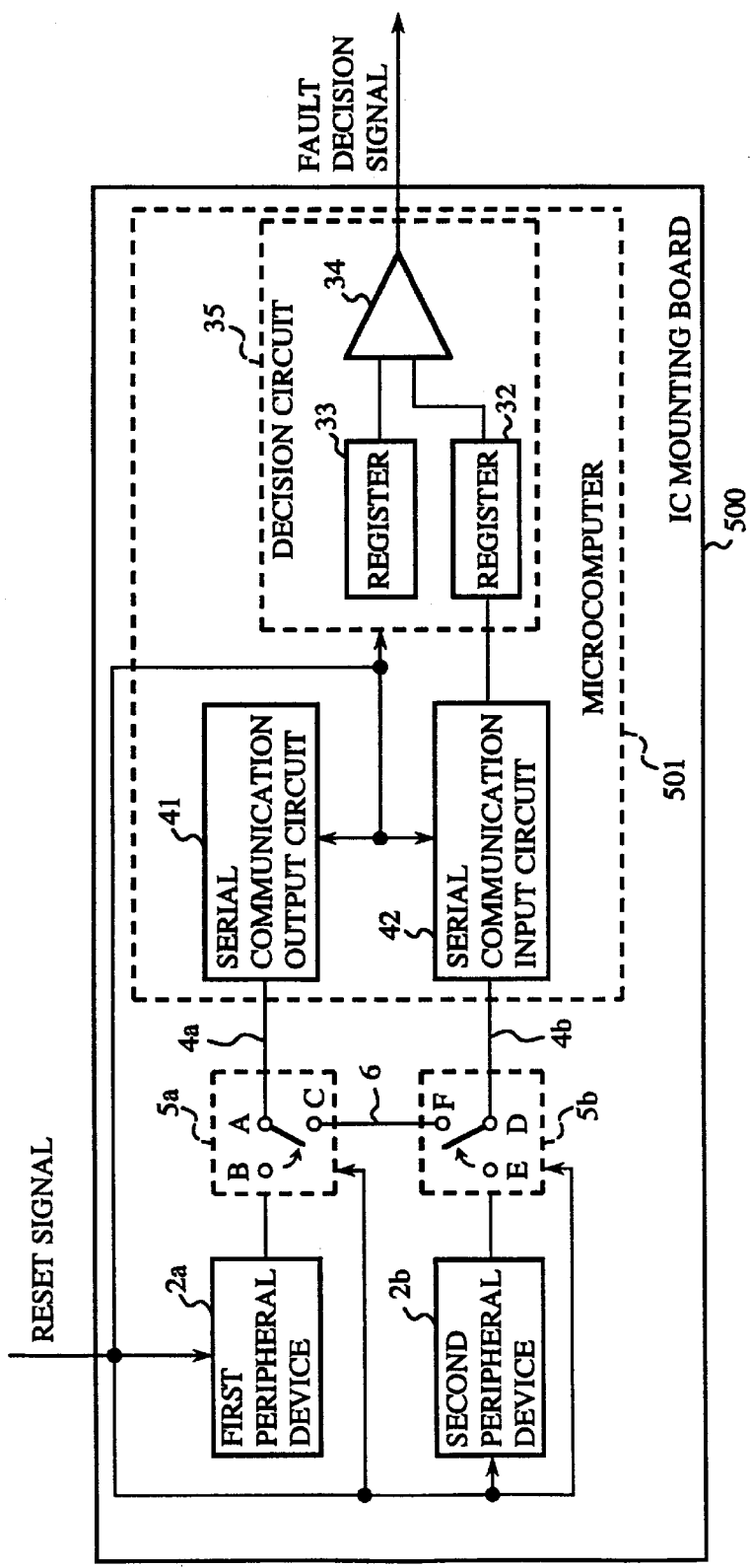
FIG. 5 is a diagram showing a configuration of a board-wiring fault detection device as a fifth embodiment according to the present invention.

FIG. 5 is a diagram showing a configuration of a board-wiring fault detection device according to a fifth embodiment according to the present invention. In FIG. 5, the reference number 500 designates an IC mounting board, 501 denotes a microcomputer. The microcomputer 501 comprises a serial communication output circuit 41 as an output means for outputting data items during a predetermined time period after a reset signal is released and a serial communication input circuit as an input means 42 for inputting the data items during the predetermined time period after the reset signal is released. Other components of the fifth embodiment are same as those in the third embodiment, therefore, the same reference number are also used in the fifth embodiment and the explanation of them is omitted here for brevity.

Next, a description will now be given of the operation of the board-wiring fault detection device of the fifth embodiment.

First, the entire operation of the board-wiring fault detection device will now be explained.

When a reset signal is released while the IC mounting board 500 is used, the board-wiring fault detection device enters a board-wiring fault detection mode. After the reset signal is released, the operation of each of the peripheral devices 2a and 2b is stopped, and the devices enter the normal operation mode after an optional constant time period has been elapsed. The first switch 5a switches from a path, formed by the node A and the node B that is used in the normal operation mode, to the path (connected to the branch wiring 6) formed by the node A and the node C after the reset signal has been released. The second switch 5b switches from a path, formed by the node D and the node E that is used in the normal operation mode, to the path (connected to the branch wiring 6) formed by the node D and the node F after the reset signal has been released.

Both the first switch 5a and the second switch 5b switch from the current paths to the paths A–B and the path D–E which are used under the normal operation mode, respectively, after the optional constant time period has been elapsed. The microcomputer 501 performs the fault detection operation during the optional constant time period and then enters the normal operation mode.

Next, the board-wiring fault detection operation of the fifth embodiment will now be explained in detail.

As described above, when the board-wiring fault detection device of the fifth embodiment enters the board-wiring fault detection mode after the reset signal has been released, both the first and second peripheral devices 2a and 2b stop those operation during the optional constant time period that has been set by hardware or software. Then, the first and second switches 5a and 5b switch from the paths A–B and D–E, that are used in the normal operation mode, to the paths A–C and D–F connected to the branch wiring 6, respectively. Thereby, a checking path for checking a fault of the board wirings 4a and 4b can be formed. This checking path is formed by the path comprising the serial communication output circuit 41, the board wiring 4a, the first switch 5a including the path A–C, the branch wiring 6 to be used for checking the board wirings 4a and 4b, the second switch 5b including the path F–D, and the board wiring 4b, and the serial communication input circuit 42.

Next, serial signals as the test signals generated by the serial communication output circuit 41, the number of the serial signals is set by the hardware or the software, outputs to outside devices during a constant time period. The pulses are provided from the serial communication output circuit 40 to the serial communication input circuit 42 through the board wiring 4a, the first switch 5a including the path A–C, the branch wiring 6 to be used for checking the board wirings 4a and 4b, the second switch 5b including the path F–D, and the board wiring 4b.

The serial communication input circuit 42 receives the serial signals during the optional constant time period set by the hardware or the software and outputs them to the register 32. The register 32 stores the serial signals output from the serial communication output circuit 41. On the other hand, the register 33 in the decision circuit 35 stores predicted values indicative of a no fault state of the board wirings 4a and 4b have no fault in advance. Accordingly, the comparator 34 compares the predicted values stored in the register 33 with the values stored in the register 32.

When the comparison result indicates that the both values stored in both the registers 32 and 33 are different, the decision circuit 35 generates a fault decision signal "NG" based on the comparison result and outputs it to the outside. Thereby, the operation of the microcomputer 501 is stopped. Since the decision signal "NG" is output form the decision circuit 35 to the outside of the IC mounting board 500, it is possible to check the failure of the IC mounting board 500 and to stop the use of this IC mounting board 500.

On the other hand, when both the values stored in the registers 32 and 33 are equal, the decision circuit 35 generates a decision signal "OK" based on the decision result and outputs it to the outside. Thereby, the microcomputer 501 enters the normal operation mode after an optional constant time period has elapsed. The peripheral devices 2a and 2b also enter the normal operation mode after the optional constant time period has elapsed. These timings to detect the fault of the board-wirings 4a and 4b by the microcomputer 501 and the peripheral devices 2a and 2b can be set by hardware or software. These timings are also synchronized to each other. Further, the timings required to re-enter or return to the normal operation mode for both the peripheral devices 2a and 2b and the microcomputer 501 are set by the hardware or the software in advance and these timings are synchronized to each other. Therefore, the peripheral devices 2a and 2b and the microcomputer 501 can perform normal operations after the board-wiring fault detection mode.

As described above, according to the board-wiring fault detection device of the fifth embodiment, the serial signals as the test signals output from the serial communication output circuit 41 incorporated in the microcomputer 501 are inputted to the serial communication output circuit 42 through the board wirings 4a and 4b, and the branch wiring 6. Thereby, it is possible to detect the fault of the board-wirings 4a and 4b by using the microcomputer 501 itself and it is possible to prevent occurrences of problems such as an non-matching to other devices, an occurrence of an accident and the like caused when the IC mounting board 500 having the fault board wirings 4a and 4b is used. In addition to this, because the fault detection operation of the board wirings 4a and 4b is performed by using the serial communication output circuit 41, the serial communication input circuit 42, the register 32, and the register 33 incorporated in the microcomputer 501, there is no requirement to add any IC used for detecting the fault of the board-wirings 4a and 4b. This decreases the design time and the cost of the IC mounting board 500 incorporating the various devices such as the peripheral devices 2a and 2b and the microcomputer 501 and the like.

As described above in detail, according to the present invention, a board wiring fault detection device for testing whether a board-wiring connected between a peripheral device and a microcomputer is in a fault state or not, comprises the peripheral device for generating and outputting a test signal, input means for receiving the test signal output from the peripheral device after a reset signal has been released, first memory means for storing the output from the input means, second memory means for storing a predicted data item that is a data item to be stored in the first memory means when a board wiring being in no fault state, and comparison decision means for comparing the data stored in the first memory means with the data stored in the second memory means and for outputting a fault decision signal as a comparison result. It is thereby possible to detect a fault of the board-wiring every releasing of a reset signal. it is also possible to prevent occurrences of problems such as an occurrence of un-matching to other devices, an occurrence of an accident and the like caused when an IC mounting board having the fault board wiring is used. In addition to this, because the fault detection operation of the board wiring is performed by using the microcomputer, there is the effect that it is not required to add any IC used for detecting the fault of the board-wiring. This causes to decrease the design time and the cost of the IC mounting board incorporating the various devices such as the peripheral device and the microcomputer and the like.

In addition, according to the present invention, the input means is an analogue/digital conversion means for converting an analogue signal as a test signal output from the peripheral device to digital signals during an optionally-set time period, and both the first memory means and the second memory means are registers. It is thereby possible to detect a fault of the board-wiring every releasing of a reset signal by using the A/D conversion means and the registers incorporated in the microcomputer. Therefore there is the effect that it is not required to add a fault detection IC for detecting the fault of the board wiring.

Furthermore, according to the present invention, the input means is a pulse count timer for counting pulses as test signals transferred from the peripheral device during an optionally-set time period, and both the first memory means and the second memory means are registers. It is thereby possible to detect a fault of the board-wiring every releasing of a reset signal by using the pulse count timer and the registers incorporated in the microcomputer. Therefore there is the effect that it is not required to add a fault detection IC for detecting the fault of the board wiring.

Moreover, according to the present invention, a board wiring fault detection device for testing whether a first board-wiring and a second board wiring connected between a first peripheral device and a second peripheral device and a microcomputer are in a fault state or not, comprises a first switch and a second switch having timer function for electrically connecting the first board wiring and the second board wiring to a board wiring check path during an optionally-set time period in a board wiring test mode after a reset signal has been released, output means for outputting a test signal to the first peripheral device and for outputting a test signal during the board-wiring test mode to the board wiring check path; input means for inputting signal output from the second peripheral device and for inputting the test signal through the board-wiring check path during the board wiring test mode, first memory means for storing the output from the input means, second memory means for storing a predicted data item that is a data item to be stored in the first memory means when the first board wiring and the second board wiring being in no fault state, and comparison decision means for comparing the data stored in the first memory means with the data stored in the second memory means and for outputting a fault decision signal as a comparison result. It is thereby possible to detect a fault of the board-wirings every releasing of a reset signal. It is also possible to prevent occurrences of problems such as an occurrence of un-matching to other devices, an occurrence of an accident and the like caused when an IC mounting board having the fault board wiring is used. In addition to this, because the fault detection operation of the board wirings is performed by using the microcomputer, there is the effect that it is not required to add any IC used for detecting the fault of the board-wiring. This causes to decrease the design time and the cost of the IC mounting board incorporating the various devices such as the peripheral device and the microcomputer and the like.

In addition, according to the present invention, the output means is a digital/analogue conversion means for outputting an analogue signal as a test signal, the input means is an analogue/digital conversion means for converting the analogue signal to digital signals, and both the first memory means and the second memory means are registers. It is thereby possible to detect a fault of the board-wiring every releasing of a reset signal by using the D/A conversion means, the A/D conversion means and the registers incorporated in the microcomputer. Therefore there is the effect that it is not required to add a fault detection IC for detecting the fault of the board wiring.

Furthermore, according to the present invention, the output means is a pulse output timer for outputting pulses during an optionally-set time period after a reset signal has been released, the input means is a pulse count timer for counting the number of the pulses as test signals during the optionally-set time period, and both the first memory means and the second memory means are registers. It is thereby possible to detect a fault of the board-wiring every releasing of a reset signal by using the pulse output timer, the pulse count timer and the registers incorporated in the microcomputer. Therefore there is the effect that it is not required to add a fault detection IC for detecting the fault of the board wiring.

Moreover, according to the present invention, the output means is a serial communication output circuit for outputting a data item as a test signal, the input means is a serial communication input circuit for inputting the data item, and both the first memory means and the second memory means are registers. It is thereby possible to detect a fault of the board-wiring every releasing of a reset signal by using the serial communication output circuit, the serial communication input circuit and the registers incorporated in the microcomputer. Therefore there is the effect that it is not required to add a fault detection IC for detecting the fault of the board wiring.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. An on-board wiring fault detection device for testing whether board wiring connected between a peripheral device and a microcomputer is in a fault state, comprising:

an integrated circuit (IC) mounting board including board wiring to be tested;

a peripheral device mounted on the IC mounting board for generating and outputting a test signal;

a microcomputer mounted on the IC mounting board for detecting faults in the board wiring, the microcomputer including:

input means for receiving the test signal output from the peripheral device after a reset signal has been released;

first memory means for storing the test signal output from the input means as a first data item;

second memory means for storing a predicted data item to be compared to the first data item stored in the first memory means, the predicted data item being indicative of a no fault state of board wiring; and comparison decision means for comparing the first data item stored in the first memory means with the predicted data item stored in the second memory means and for outputting a fault decision signal as a comparison result.

2. The on-board wiring fault detection device as claimed in claim 1, wherein the input means comprises analog-to-digital conversion means for converting an analog signal as the test signal output from the peripheral device into a digital signal during an optionally set time period, and both the first memory means and the second memory means comprise registers.

3. The one board wiring fault detection device as claimed in claim 1, wherein the input means comprises a pulse count timer for counting pulses as the test signal transferred from the peripheral device during a first time period and both the first memory means and the second memory means comprises registers.

4. An on-board wiring fault detection device for testing whether a first board wiring and a second board wiring connected between a first peripheral device and a second peripheral device and a microcomputer are in a fault state, comprising:

an integrated circuit (IC) mounting board including first and second board wirings to be tested;

a branch wire for connecting the first and second board wirings to each other;

a first switch and a second switch, each of the first and second switches having a timer, for electrically connecting the first board wiring and the second board wiring to the branch wire during a first time period in a board wiring test mode after a reset signal has been released;

a first peripheral device mounted on the IC mounting board and coupled to the first switch;

a second peripheral device mounted on the IC mounting board and coupled to the second switch;

a microcomputer mounted on the IC mounting board for detecting faults in the first and second board wirings, the microcomputer including:

output means for outputting a test signal during the board wiring test mode to the first board wiring;

input means for receiving a signal output from the second peripheral device through the second board wiring and for receiving the test signal transmitted from the output means through the first and second board wirings, the first and second switches, and the branch wire during the board wiring test mode, and for producing an output value indicative of the test signal;

first memory means for storing the output value from the input means as a first data item;

second memory means for storing a predicted data item to be compared to the first data item stored in the first memory means, the predicted data item being indicative of a no fault state of the first board wiring and the second board wiring; and comparison decision means for comparing the first data item stored in the first memory means with the predicted data item stored in the second memory means and for outputting a fault decision signal as a comparison result.

5. The on-board wiring fault detection device as claimed in claim 4, wherein the output means comprises a digital-to-analog conversion means for outputting analog signal as the test signal, the input means comprises analog-to-digital conversion means for converting the analog signal to a digital signal, and both the first memory means and the second memory means comprise registers.

6. The on-board wiring fault detection device as claimed in claim 4, wherein the output means comprises a pulse output timer for outputting pulses as the test signal during the first time period after the reset signal has been released, the input means comprises a pulse count timer for counting the number of the pulses during the first time period, and both the first memory means and the second memory means comprise registers.

7. The on-board wiring fault detection device as claimed in claim 4, wherein the output means is a serial communication output circuit for outputting a data item as the test signal, the input means comprises a serial communication input circuit for inputting the data item, and both the first memory means and the second memory means comprise registers.

* * * * *